United States Patent
Wang et al.

(10) Patent No.: US 9,269,896 B2
(45) Date of Patent: Feb. 23, 2016

(54) CONFINED DEFECT PROFILING WITHIN RESISTIVE RANDOM MEMORY ACCESS CELLS

(71) Applicants: Intermolecular Inc., San Jose, CA (US); Kabushiki Kaisha Toshiba, Tokyo (JP); SanDisk 3D LLC, Milpitas, CA (US)

(72) Inventors: Yun Wang, San Jose, CA (US); Vidyut Gopal, Sunnyvale, CA (US); Chien-Lan Hsueh, Campbell, CA (US)

(73) Assignees: Intermolecular, Inc., San Jose, CA (US); Kabushiki Kaisha Toshiba, Tokyo (JP); SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 14/519,376

(22) Filed: Oct. 21, 2014

(65) Prior Publication Data

US 2015/0034898 A1   Feb. 5, 2015

Related U.S. Application Data

(63) Continuation of application No. 13/891,472, filed on May 10, 2013, now Pat. No. 8,913,418.

(60) Provisional application No. 61/782,609, filed on Mar. 14, 2013.

(51) Int. Cl.
*H01L 45/00* (2006.01)
*G11C 13/00* (2006.01)

(52) U.S. Cl.
CPC ............ *H01L 45/10* (2013.01); *G11C 13/0002* (2013.01); *G11C 13/0007* (2013.01); *H01L 45/08* (2013.01); *H01L 45/1253* (2013.01); *H01L 45/1266* (2013.01); *H01L 45/145* (2013.01); *H01L 45/146* (2013.01); *H01L 45/1616* (2013.01); *H01L 45/1625* (2013.01); *H01L 45/1641* (2013.01); *G11C 2213/15* (2013.01); *G11C 2213/51* (2013.01); *G11C2213/56* (2013.01); *G11C 2213/71* (2013.01); *G11C 2213/77* (2013.01)

(58) Field of Classification Search
CPC ... H01L 45/1233; H01L 45/146; H01L 45/14; H01L 45/05; H01L 45/10; G11C 13/0007; G11C 2213/56; G11C 13/0002
USPC .......................................................... 257/4
See application file for complete search history.

(56) References Cited

U.S. PATENT DOCUMENTS

| | | | | |
|---|---|---|---|---|
| 2009/0309690 A1* | 12/2009 | Kinoshita et al. | | 338/20 |
| 2013/0193396 A1* | 8/2013 | Nakano et al. | | 257/4 |
| 2013/0299763 A1* | 11/2013 | Moon et al. | | 257/1 |
| 2014/0206138 A1* | 7/2014 | Desu et al. | | 438/104 |

* cited by examiner

Primary Examiner — Tom Thomas
Assistant Examiner — John Bodnar (57) ABSTRACT

Provided are resistive random access memory (ReRAM) cells and methods of fabricating thereof. A stack including a defect source layer, a defect blocking layer, and a defect acceptor layer disposed between the defect source layer and the defect blocking layer may be subjected to annealing. During the annealing, defects are transferred in a controllable manner from the defect source layer to the defect acceptor layer. At the same time, the defects are not transferred into the defect blocking layer thereby creating a lowest concentration zone within the defect acceptor layer. This zone is responsible for resistive switching. The precise control over the size of the zone and the defect concentration within the zone allows substantially improvement of resistive switching characteristics of the ReRAM cell. In some embodiments, the defect source layer includes aluminum oxynitride, the defect blocking layer includes titanium nitride, and the defect acceptor layer includes aluminum oxide.

15 Claims, 8 Drawing Sheets

FIG. 1A

Initial Forming

FIG. 1B

Operational Switching

CONFINED DEFECT PROFILING WITHIN RESISTIVE RANDOM MEMORY ACCESS CELLS

CROSS-REFERENCE TO RELATED APPLICATION

This is a Continuation application of U.S. patent application Ser. No. 13/891,472, filed on May 10, 2013, which claims priority to U.S. Provisional Application Ser. No. 61/782,609 filed on Mar. 14, 2013, each of which is herein incorporated by reference for all purposes.

BACKGROUND

Nonvolatile memory is computer memory capable of retaining the stored information even when unpowered. Nonvolatile memory may be used for secondary storage or long-term persistent storage, for example, in addition to volatile memory. Nonvolatile memory can be permanently integrated into computer systems (e.g., solid state hard drives) or it can take the form of removable and easily transportable memory cards (e.g., USB flash drives). Nonvolatile memory is becoming more popular because of its small size and high density, low power consumption, fast read and write rates, data retention, and other characteristics.

Flash memory is a common type of nonvolatile memory because of its high density and low fabrication costs. Flash memory is a transistor-based memory device that uses multiple gates per transistor and quantum tunneling for storing the information on its memory device. Flash memory uses a block-access architecture that can result in long access, erase, and write times. Flash memory also suffers from low endurance, high power consumption, and scaling limitations.

The constantly increasing speed of electronic devices and storage demand drive new requirements for nonvolatile memory. For example, nonvolatile memory is expected to replace hard drives in many new computer systems. However, transistor-based flash memory is often inadequate to meet the requirements for nonvolatile memory. New types of memory, such as resistive random access memory (ReRAM), are being developed to meet these demands and requirements.

SUMMARY

Provided are resistive random access memory (ReRAM) cells and methods of fabricating thereof. A stack including a defect source layer, a defect blocking layer, and a defect acceptor layer disposed between the defect source layer and the defect blocking layer may be subjected to annealing. During the annealing, defects are transferred in a controllable manner from the defect source layer to the defect acceptor layer. At the same time, the defects are not transferred into the defect blocking layer thereby creating a lowest concentration zone within the defect acceptor layer. This zone is responsible for resistive switching. The precise control over the size of the zone and the defect concentration within the zone allows improvement of resistive switching characteristics of the ReRAM cell. In some embodiments, the defect source layer includes aluminum oxynitride, the defect blocking layer includes titanium nitride, and the defect acceptor layer includes aluminum oxide.

In some embodiments, a method of fabricating a ReRAM cell involves providing a stack that include a defect source layer, a defect blocking layer, and a defect acceptor layer. In this stack, the defect acceptor layer is disposed between the defect source layer and the defect blocking layer. The method continues with annealing, which transfers defects from the defect source layer to the defect acceptor layer. This transfer creates a resistive switching zone within the defect acceptor layer. The resistive switching zone has a predetermined concentration of defects. No defects are transferred from the defect acceptor layer to the defect blocking layer during this last operation, i.e., transferring defects from the defect source layer to the defect acceptor layer. In some embodiments, this operation involves annealing the stack at a temperature of between 500° C. and 800° C. for between 30 seconds and 30 minutes. For example, a standard activation anneal of 750° C. for 1 minute may be used.

Some examples of defects include oxygen, nitrogen, carbon, and silicon. In some embodiments, defects are provided within the defect blocking layer. For example, the defect blocking layer may be formed from titanium nitride and nitrogen may be used as defects. Some of the defects in the defect blocking layer may be transferred to the defect source layer. In some embodiments, the defect blocking layer includes a metal and substantially no metal is transferred from the defect blocking layer to the defect source layer. In other words, the metal in the defect blocking layer does not become a source of defects within the resistive switching zone. This approach is contrary to many conventional approaches, in which metal layers are used as a source of defects, e.g., as a source of oxygen vacancies.

In some embodiments, the defect blocking layer may be one of silicon oxide, aluminum oxide, hafnium oxide, zirconium oxide, titanium nitride, tantalum nitride, or aluminum nitride. The defect blocking layer may be operable as an electrode. In some embodiments, the defect acceptor layer and the defect source layer include the same metal. The defect source layer may include one of $AlO_xN_y$, $HfO_xNy$, $ZrO_xN_y$, $SiO_xN_y$, $TiO_x$, or $TaO_x$. For example, the defect source layer includes $alO_xN_y$, while the defect acceptor layer includes $Al_2O_3$ prior to the annealing.

In some embodiments, the defect source layer includes between about 10 atomic percent and 30 atomic percent of nitrogen on average prior to the annealing. This nitrogen may be distributed non-uniformly throughout a thickness of the defect source layer prior to the annealing. For example, more nitrogen may be present within the defect source layer at its interface with the defect acceptor layer than elsewhere in the defect source layer prior to the annealing.

The defect source layer and the defect acceptor layer are used to form a resistive switching zone by annealing, which transfers defects from the defect source layer and into the defect acceptor layer. In some embodiments, the resistive switching zone includes between about 1 atomic percent and 15 atomic percent of nitrogen on average after the annealing or, more specifically, less than 10 atomic percent of nitrogen on average. The resistive switching zone may have the lowest nitrogen concentration within the defect acceptor layer and the defect source layer. The resistive switching zone may include the lowest nitrogen concentration within the defect acceptor layer and the defect blocking layer.

In some embodiments, a method of fabricating a resistive random access memory cell involves providing a first layer including aluminum oxide. The first layer may have a thickness of between about 20 Angstroms and about 100 Angstroms. The method may proceed with introducing nitrogen into the first layer. This operation may involve plasma nitridation using ammonia. The first layer may include between about 15 atomic percent and 25 atomic percent on average after introducing nitrogen. The method may proceed with depositing a second layer including aluminum oxide over the first layer. The second layer may have a thickness of between about 20 Angstroms to about 100 Angstroms. The method may proceed with depositing a third layer including titanium nitride over the second layer. The method may proceed with annealing the first layer, the second layer, and the third layer at between about 700° C. and 800° C. for between about 0.5 minutes and 2 minutes. Annealing results in transferring nitrogen from the first layer and into the second layer while no nitrogen is transferred from the second layer and into the third layer. After annealing, the second layer has a lowest nitrogen concentration zone between the first layer and the second layer. The lowest nitrogen concentration zone may have a nitrogen concentration of less than 10 atomic percent.

Provided also a ReRAM cell including a first layer having aluminum, oxygen, and nitrogen. The first layer may have a thickness of between about 20 Angstroms to about 100 Angstroms. The ReRAM call also includes a second layer including aluminum, oxygen, and nitrogen. The second layer disposed over the first layer. The second layer may have a thickness of between about 20 Angstroms to about 100 Angstroms. The ReRAM cell also includes a third layer having titanium nitride. The third layer is disposed over the second layer. The second layer has a lowest nitrogen concentration zone within the first layer and the second layer. The lowest nitrogen concentration zone has a nitrogen concentration of less than 10 atomic percent.

BRIEF DESCRIPTION OF THE DRAWINGS

To facilitate understanding, the same reference numerals have been used, where possible, to designate common components presented in the figures. The drawings are not to scale and the relative dimensions of various elements in the drawings are depicted schematically and not necessarily to scale. Various embodiments can readily be understood by considering the following detailed description in conjunction with the accompanying drawings, in which.

DETAILED DESCRIPTION

A detailed description of various embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

Introduction

A memory cell exhibiting resistive switching characteristics, which is often referred to as a ReRAM cell, generally includes multiple layers formed into a stack. The overall structure of this stack is sometimes described as a Metal-Insulator-Metal (MIM). Specifically, the stack includes two conductive layers operating as electrodes. These layers are identified as "M" and may include metals and/or other conductive materials, such as titanium nitride or doped polysilicon. The stack also includes one or more insulator layers provided in between the electrodes. These layers may be collectively identified as "I" in the above naming convention. The insulator layer or a portion within multiple layers exhibits resistive switching properties characterized by different resistive states of the material forming this layer or the portion. As such, this insulator layer may be referred to as a resistive switching layer. These resistive states may be used to represent one or more bits of information. Each of these three main layers may include any number of sub-layers. Furthermore, a ReRAM may include additional layers as further described below.

The ReRAM cell changes its resistive state by applying one or more voltage pulses (e.g., set voltage pulses to go from a higher resistance to a lower resistance or reset voltage pulses to go from a lower resistance to a high resistance) to the cell as further explained below. The applied voltage causes some localized heating within the switching zone within the cell. Without being restricted to any particular theory, it is believed that a combination of the electrical field and localized heating (both created by the applied voltage) causes formation and breakage of various conductive paths within the switching zone. It is believed that various defects change their location forming the conductive paths (when the set voltage is applied) and breaking the conductive paths (when the reset voltage is applied) and causing changes in the resistance. For example, an aluminum oxide layer may include some nitrogen that can form conductive paths within the layer.

For purposes of this disclosure, defects are defined as any materials or vacancies that can change their orientations within the switching zone based on applied voltage. This change in orientation causes formation of the conductive paths or breaking of the conductive paths, which results in changes of the resistance. Not all materials or vacancies present in the switching zone may function as defects. Some materials or vacancies may not be sufficiently mobile, while mobility of other materials or vacancies may not impact the resistance. The defects should be sufficiently mobile materials or vacancies. For example, a low concentration (e.g., less than 10 atomic percent or even less than 5 atomic percent) of nitrogen in an aluminum oxide layer may be used defects.

Typically, only one type of defect is used within one layer. Having multiple types of defects operating simultaneously within the switching zone may interfere with resistive switching characteristics and may be difficult, if possible at all to control. The defects may be introduced by doping a base material, which may be an oxide and/or a nitride of one or more transition metals. Dopant atoms replace base material atoms in the original base material structure (e.g., its lattice) causing stresses within this structure. These stresses make it is easier to form conductive paths through the doped structure than, for example, to form similar paths through an undoped structure.

Defects should be introduced into a switching zone in a controlled manner. The amount of defects in this zone should be sufficient to form some conductive paths during a set operation, i.e., going from a low resistance to a high resistance. At the same time, the level of defects should not be excessive in order to be able break these paths during a reset operation, i.e., going from a high resistance to a low resistance. In other words, if the switching zone does not have enough defects, then the conductive paths may be hard to form if these paths can be formed at all. Excessive set voltages may be needed to achieve an adequate change in resistance. On the other hand, if the switching zone has too many defects, then the conductive paths may be difficult to break as there are many conductive paths capable of conductive electrical current and larger overall power may be required.

As such, tight control of the amount of defects available within the switching zone may help to reduce switching voltages (i.e., set voltages and reset voltages) and reduce the overall power required to operate the ReRAM cell. Another consideration for lowering the switching voltages and operating power is the thickness of the layers of the ReRAM cell and in particular the thickness of the switching zone. Without being restricted to any particular theory, it is believed that thinner layers require lower switching voltages. In some embodiments, the layers used to form and contain the zone may be less than 100 Angstroms thick, for example, 50 Angstroms thick. Overall, ReRAM cell performance heavily depends on the amount of defects and their distribution profiles within the cell.

Precisely controlling distribution of defects in such thin layer is challenging. Furthermore, the switching zone should be well defined and differentiated from other portions within the ReRAM cell so that these other portions do not exhibit resistive switching characteristics. The switching zone may be defined by maintaining higher concentrations of defects in the portions of the cell that may be susceptible to resistive switching (i.e., have some defect mobility). While these other portions may exhibit some defect mobility, the change in resistance caused by this mobility is negligible because of relatively high concentration of defects. The switching zone and these other portions of the cell may be collectively referred to as a resistive switching layer and should be distinguished from other components, such as electrodes, current limiting layer, current steering elements, which generally do not exhibit any defect mobility. It should be noted however that some of these other components may still include defects, but these defects are relative immobile in these components.

The challenge in controlling distribution of defects within ReRAM cells is due to very thin layers used for these cells. Furthermore, ReRAM cells are often subject to high temperatures, e.g., used for annealing and activating other components, such as diodes. Materials in thin films (e.g., less 50 Angstroms) readily intermix when exposed to high temperatures that may result in uniform distribution of defect and difficulties in defining a switching zone. For example, when metal layers are used to introduce oxygen vacancies into resistive switching layers, with which the metal layers interface, the oxygen vacancies tend to have gradual distribution from one side of the resistive switching layer to another side. This phenomenon is described in more details with reference to FIGS. 5E and 5F below. It may be desirable to have a switching zone that has a lower concentration of defects than two adjacent portions. In other words, the switching zone may be defined by a drop of the defect concentration or so called a low defect concentration well. The gradual distribution of defects does not provide a similar switching effect and result in generally high switching voltages.

Furthermore, metals can easily diffuse through various layers of the ReRAM cells. Very few materials are effective blockers of metals when subjected to annealing and resistive switching conditions. Without boundary for defect movement, there is very little control that can be exerted on defect distribution.

Provided are novel ReRAM cells and methods of controlling defect distribution within the ReRAM cells. The controlled distribution is achieved by selecting specific materials for different components of the ReRAM cells, such as a defect source layer, a defect blocking layer, and a defect acceptor layer. The components are spatially arranged in a particular manner that creates a well-defined switching zone having the lowest defect concentration after annealing the cells. Furthermore, specific types of defects are used in these cells, such as elements from groups IVA, VA, and VIA of the periodic table with specific examples including carbon, nitrogen, oxygen, and silicon. A combination of these features allows achieving controlled mobility of defects between the ReRAM cell components and within these components. In some embodiments, only one type of defect or, more specifically, only one element (e.g., nitrogen) is allowed to move between and within the components. Other elements may not move because of their uniform distribution (e.g., two layer have substantially the same concentration of elements) or because they are locked within the layer (e.g., titanium in a titanium nitride layer).

Each ReRAM cell includes a defect source layer, a defect blocking layer, and a defect acceptor layer that collectively form and are referred to as a stack. In this stack, the defect acceptor layer is disposed between the defect source layer and the defect blocking layer. The defect blocking layer may also function as an electrode. The ReRAM cell may also include other layers, such as another electrode, current limiters, current steering elements, and the like.

When the stack is subjected to annealing or any other process that involves raising the temperature of the stack, the defects flow from the defect source layer and into the defect acceptor layer. This flow may be driven by the concentration gradient and, therefore, may be referred to as diffusion. The amount of defects transferred from the defect source layer and into the defect acceptor layer depends on the compositions, materials, and thicknesses of these two layers, temperature, time, and other parameters. However, the defect acceptor layer does not pass any defects into the defect blocking layer. In fact, in some embodiments, the defect blocking layer may release some defects into the defects acceptor layer. As such, a distinct zone in the defect acceptor layer is formed that has the lowest and controlled concentration of the defects. This distinct zone is believed to be responsible for resistive switching and may be tuned to use lower switching voltages than, for example, when conventional methods of introducing defects into a resistive switching layer are used. This zone is also referred to as a switching zone.

An example of a ReRAM cell will now be described to provide a better understanding of ReRAM cell structure and methods of forming and operating such structures. A layer of aluminum oxide ($Al_2O_3$) may be formed on a substrate including an electrode. The aluminum oxide layer may have a thickness of between about 50 Angstroms and 100 Angstroms. The first electrode could be any conductive material, such as doped polysilicon or, more specifically, n-doped polysilicon. Plasma nitridation or any other suitable technique may be used to introduce nitrogen into aluminum oxide to generate defects in this layer. While this modified layer now containing aluminum oxynitride can be used as a resistive switching layer, the distribution of nitrogen within the layer is gradual and will become even more gradual with subsequent annealing, which is not desirable. Furthermore, controlling the amount of nitrogen introduced into this layer may be difficult.

The ReRAM fabrication process in the above examples then continues with forming a new layer of aluminum oxide ($Al_2O_3$) over the aluminum oxynitride layer and then forming a layer of titanium nitride over the new aluminum oxide layer. In other words, the new aluminum oxide layer is disposed between the aluminum oxynitride layer and the titanium nitride layer. In this stack, the aluminum oxynitride layer functions as a defect source layer, the new aluminum oxide layer functions as a defect acceptor layer, and the titanium nitride layer functions as a defect blocking layer. The stack including these three layers is then annealed (e.g., in order to activate diodes provided on the same substrate), which causes nitrogen to transfer from the aluminum oxynitride layer to the new aluminum oxide layer. At the same time, nitrogen does not flow from the new aluminum oxide layer and into the titanium nitride layer. In fact, some nitrogen may be transferred from the titanium nitride layer and into the new aluminum oxide layer. As a result of this nitrogen transfer, the nitrogen concentration profile has a minimum within the new aluminum oxide layer. This portion of the new aluminum oxide layer becomes responsible for resistive switching and may be referred to as a switching zone. A series of experiments further described below have shown that a reset voltage for a ReRAM cell prepared in accordance with an example presented above is about 5.8V, while a reset voltage for a ReRAM cell in which the aluminum oxynitride layer is used as a resistive switching layer alone (i.e., without adding a new aluminum oxide layer) is about 7.6V.

Examples of Nonvolatile ReRAM Cells and their Switching Mechanisms

A brief description of ReRAM cells is provided for context and better understanding of various features associated with using defect blocking layers in the ReRAM cells. As stated above, a ReRAM cell includes a dielectric material exhibiting resistive switching characteristics. A dielectric, which is normally insulating, can be made to conduct through one or more conductive paths formed after application of a voltage. The conductive path formation can arise from different mechanisms, including defects, metal migration, and other mechanisms further described below. Once one or more conductive paths (e.g., filaments) are formed in the dielectric component of a memory device, these conductive paths may be reset (or broken resulting in a high resistance) or set (or re-formed resulting in a lower resistance) by applying certain voltages. Without being restricted to any particular theory, it is believed that resistive switching corresponds to migration of defects within the resistive switching layer and, in some embodiments, across one interface formed by the resistive switching voltage, when a switching voltage is applied to the layer.

Figure 1A:
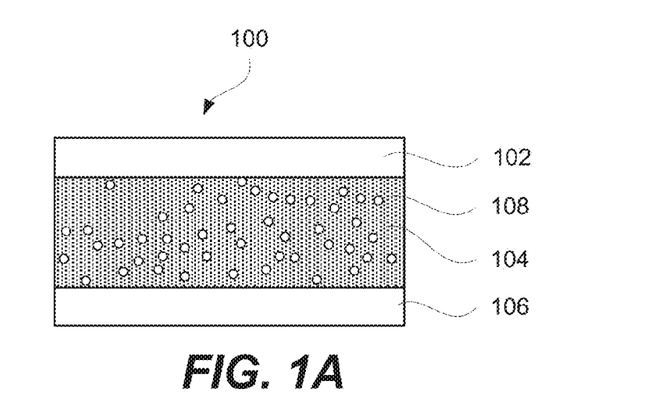
FIG. 1A illustrate schematic representations of a ReRAM cell prior to initial forming operation, in accordance with some embodiments.

FIG. 1A illustrates a schematic representation of ReRAM cell 100 including top electrode 102, bottom electrode 106, and resistance switching layer 104 disposed in between top electrode 102 and bottom electrode 106. It should be noted that the "top" and "bottom" references for electrodes 102 and 106 are used solely for differentiation and not to imply any particular spatial orientation of these electrodes. Often other references, such as "first formed" and "second formed" electrodes or simply "first" and "second", are used identify the two electrodes. ReRAM cell 100 may also include other components, such as an embedded resistor, diode, diffusion barrier layer, and other components. ReRAM cell 100 is sometimes referred to as a memory element or a memory unit.

Top electrode 102 and bottom electrode 106 may be used as conductive lines within a memory array or other types of devices that ReRAM cell is integrated into. As such, electrode 102 and 106 are generally formed from conductive materials. As stated above, one of the electrodes may be reactive electrode and act as a source and as a reservoir of defects for the resistive switching layer. That is, defects may travel through an interface formed by this electrode with the resistive switching layer (i.e., the reactive interface).

Resistance switching layer 104 which may be initially formed from a dielectric material and later can be made to conduct through one or more conductive paths formed within the layer by applying first a forming voltage and then a switching voltage. To provide this resistive switching functionality, resistance switching layer 104 includes a concentration of electrically active defects 108, which may be at least partially provided into the layer during its fabrication. For example, some atoms may be absent from their native structures (i.e., creating vacancies) and/or additional atoms may be inserted into the native structures (i.e., creating interstitial defects). Charge carriers may be also introduced as dopants, stressing lattices, and other techniques. Regardless of the types all charge carriers are referred to as defects 108.

FIG. 1A is a schematic representation of ReRAM cell 100 prior to initial formation of conductive paths, in accordance with some embodiments. Resistive switching layer 104 may include some defects 108. Additional defects 108 may be provided within top electrode 102 and may be later transferred to resistive switching layer 104 during the formation operation. In some embodiments, the resistive switching layer 104 has substantially no defects prior to forming operation and all defects are provided from top electrode 102 during forming. Bottom electrode 106 may or may not have any defects. It should be noted that regardless of presence or absence of defects in bottom electrode 106, substantially no defects are exchanged between bottom electrode 106 and resistive switching layer 104 during forming and/or switching operations.

Figure 1B:
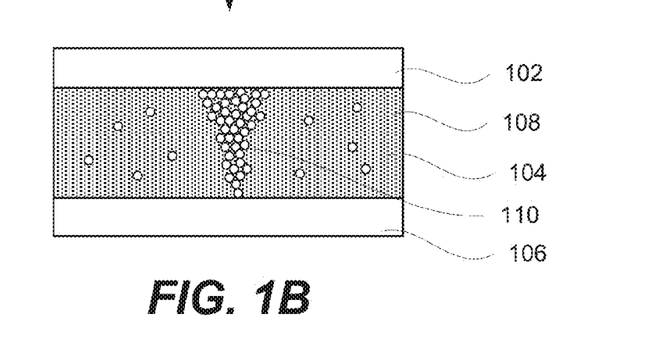
FIGS. 1B and 1C illustrate schematic representations of the ReRAM cell in its high resistive state (HRS) and low resistive state (LRS), in accordance with some embodiments.

During the forming operation, ReRAM cell 100 changes its structure from the one shown in FIG. 1A to the one shown in FIG. 1B. This change corresponds to defects 108 being arranged into one or more continuous paths within resistive switching layer 104 as, for example, schematically illustrated in FIG. 1B. Without being restricted to any particular theory, it is believed that defects 108 can be reoriented within resistance switching layer 104 to form these conductive paths as, for example, schematically shown in FIG. 1B. Furthermore, some or all defects 108 forming the conductive paths may enter resistive switching layer 104 from top electrode 102. For simplicity, all these phenomena are collectively referred to as reorientation of defects within ReRAM cell 100. This reorientation of defects 108 occurs when a certain forming voltage is applied to electrodes 102 and 106. In some embodiments, the forming operation also conducted at elevated temperatures to enhanced mobility of the defects within ReRAM cell 100. In general, the forming operation is considered to be a part of the fabrication of ReRAM cell 100, while subsequent resistive switching is considered to be a part of operation of ReRAM cell.

Figure 1C:
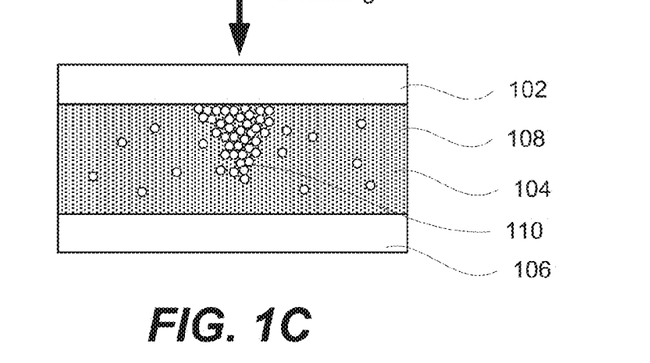

Resistive switching involves breaking and reforming conductive paths through resistive switching layer 104, i.e., switching between the state schematically illustrated in FIG. 1B and the state schematically illustrated in FIG. 1C. The resistive switching is performed by applying switching voltages to electrodes 102 and 106. Depending on magnitude and polarity of these voltages, conductive path 110 may be broken or formed back again. These voltages may be substantially lower than forming voltages (i.e., voltages used in the forming operation) since much less mobility of defects is needed during switching operations. For example, hafnium oxide based resistive layers may need about 7 Volts during their forming but can be switched using voltages less than 4 Volts.

The state of resistive switching layer 104 illustrated in FIG. 1B is referred to as a low resistance state (LRS), while the state illustrated in FIG. 1C is referred to as a high resistance state (HRS). The resistance difference between the LRS and HRS is due to different number and/or conductivity of conductive paths that exists in these states, i.e., resistive switching layer 104 has more conductive paths and/or less resistive conductive paths when it is in the LRS than when it is in the HRS. It should be noted that resistive switching layer 104 may still have some conductive paths while it is in the HRS, but these conductive paths are fewer and/or more resistive than the ones corresponding to the LRS.

When switching from its LRS to HRS, which is often referred to as a reset operation, resistive switching layer 104 may release some defects into top electrode 102. Furthermore, there may be some mobility of defects within resistive switching layer 104. This may lead to thinning and, in some embodiments, breakages of conductive paths as shown in FIG. 1C. Depending on mobility within resistive switching layer 104 and diffusion through the interface formed by resistive switching layer 104 and top electrode 102, the conductive paths may break closer to the interface with bottom electrode 106, somewhere within resistive switching layer 104, or at the interface with top electrode 102. This breakage generally does not correspond to complete dispersion of defects forming these conductive paths and may be a self-limiting process, i.e., the process may stop after some initial breakage occurs.

When switching from its HRS to LRS, which is often referred to as a set operation, resistive switching layer 104 may receive some defects from top electrode 102. Similar to the reset operation described above, there may be some mobility of defects within resistive switching layer 104. This may lead to thickening and, in some embodiments, reforming of conductive paths as shown in FIG. 1B. In some embodiments, a voltage applied to electrodes 102 and 104 during the set operation has the same polarity as a voltage applied during the reset operation. This type of switching is referred to as unipolar switching. Alternatively, a voltage applied to electrodes 102 and 104 during the set operation may have different polarity as a voltage applied during the reset operation. This type of switching is referred to as bipolar switching. Setting and resetting operations may be repeated multiple times as will now be described with reference to FIGS. 2A and 2B.

Figure 2A:
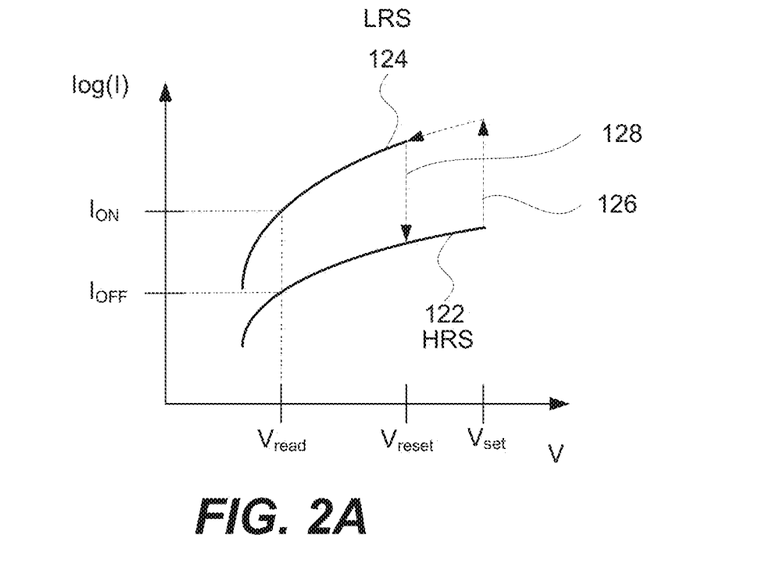
FIG. 2A illustrates a plot of a current passing through a unipolar ReRAM cell as a function of a voltage applied to the ReRAM cell, in accordance with some embodiments.
Figure 2B:
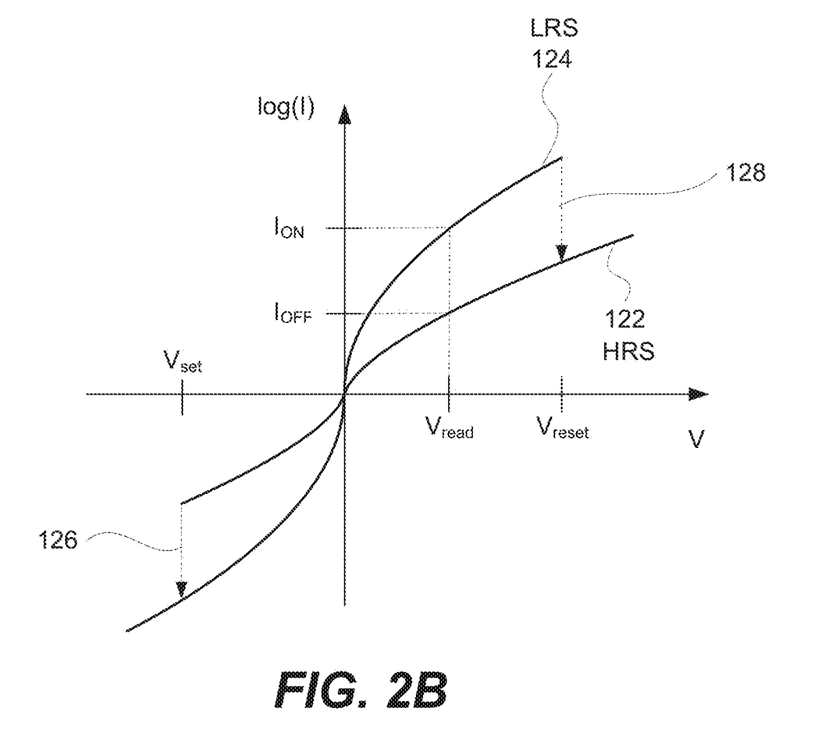
FIG. 2B illustrates a plot of a current passing through a bipolar ReRAM cell as a function of a voltage applied to the ReRAM cell, in accordance with some embodiments.

Specifically, FIG. 2A illustrates a plot of a current passing through a unipolar ReRAM cell as a function of a voltage applied to the ReRAM cell, in accordance with some embodiments. FIG. 2B illustrates the same type of a plot for a bipolar ReRAM cell, in accordance with some embodiments. The HRS is defined by line 122, while the LRS is defined by 124 in both plots. Each of these states is used to represent a different logic state, e.g., the HRS may represent logic one ("1") and LRS representing logic zero ("0") or vice versa. Therefore, each ReRAM cell that has two resistance states may be used to store one bit of data. It should be noted that some ReRAM cells may have three and even more resistance states allowing multi-bit storage in the same cell.

The overall operation of the ReRAM cell may be divided into a read operation, set operation (i.e., turning the cell "ON" by changing from its HRS to LRS), and reset operation (i.e., turning the cell "OFF" by changing from its LRS to HRS). During the read operation, the state of the ReRAM cell or, more specifically, the resistive state of its resistance of resistance switching layer can be sensed by applying a sensing voltage to its electrodes. The sensing voltage is sometimes referred to as a "READ" voltage or simply a reading voltage and indicated as $V_{READ}$ in FIG. 2. If the ReRAM cell is in its HRS (represented by line 122 in FIGS. 2A and 2B), the external read and write circuitry connected to the electrodes will sense the resulting "OFF" current ($I_{OFF}$) that flows through the ReRAM cell. As stated above, this read operation may be performed multiple times without changing the resistive state (i.e., switching the cell between its HRS and LRS). In the above example, the ReRAM cell should continue to output the "OFF" current ($I_{OFF}$) when the read voltage ($V_{READ}$) is applied to the electrodes for the second time, third time, and so on.

Continuing with the above example, when it is desired to turn "ON" the cell that is currently in the HRS switch, a set operation is performed. This operation may use the same read and write circuitry to apply a set voltage ($V_{SET}$) to the electrodes. Applying the set voltage forms one or more conductive paths in the resistance switching layer as described above with reference to FIGS. 1B and 1C. The switching from the HRS to LRS is indicated by dashed line 126 in FIGS. 2A and 2B. The resistance characteristics of the ReRAM cell in its LRS are represented by line 124. When the read voltage ($V_{READ}$) is applied to the electrodes of the cell in this state, the external read and write circuitry will sense the resulting "ON" current ($I_{ON}$) that flows through the ReRAM cell. Again, this read operation may be performed multiple times without switching the state of the ReRAM cell.

At some point, it may be desirable to turn "OFF" the ReRAM cell by changing its state from the LRS to HRS. This operation is referred to as a reset operation and should be distinguished from set operation during which the ReRAM cell is switched from its HRS to LRS. During the reset operation, a reset voltage ($V_{RESET}$) is applied to the ReRAM cell to break the previously formed conductive paths in the resistance switching layer. Switching from a LRS to HRS is indicated by dashed line 128. Detecting the state of the ReRAM cell while it is in its HRS is described above.

Overall, the ReRAM cell may be switched back and forth between its LRS and HRS many times. Read operations may be performed in each of these states (between the switching operations) one or more times or not performed at all. It should be noted that application of set and reset voltages to change resistance states of the ReRAM cell involves complex mechanisms that are believed to involve localized resistive heating as well as mobility of defects impacted by both temperature and applied potential.

In some embodiments, the set voltage ($V_{SET}$) is between about 100 mV and 10V or, more specifically, between about 500 mV and 5V. The length of set voltage pulses ($t_{SET}$) may be less than about 100 milliseconds or, more specifically, less than about 5 milliseconds and even less than about 100 nanoseconds. The read voltage ($V_{READ}$) may be between about 0.1 and 0.5 of the write voltage ($V_{SET}$). In some embodiments, the read currents ($I_{ON}$ and $I_{OFF}$) are greater than about 1 mA or, more specifically, is greater than about 5 mA to allow for a fast detection of the state by reasonably small sense amplifiers. The length of read voltage pulse ($t_{READ}$) may be comparable to the length of the corresponding set voltage pulse ($t_{SET}$) or may be shorter than the write voltage pulse ($t_{RESET}$). ReRAM cells should be able to cycle between LRS and HRS between at least about $10^3$ times or, more specifically, at least about $10^7$ times without failure. A data retention time ($t_{RET}$) should be at least about 5 years or, more specifically, at least about 10 years at a thermal stress up to 85° C. and small electrical stress, such as a constant application of the read voltage ($V_{READ}$). Other considerations may include low current leakage, such as less than about 40 A/cm$^2$ measured at 0.5 V per 20Å of oxide thickness in HRS.

Examples of ReRAM Cells

Figure 3:
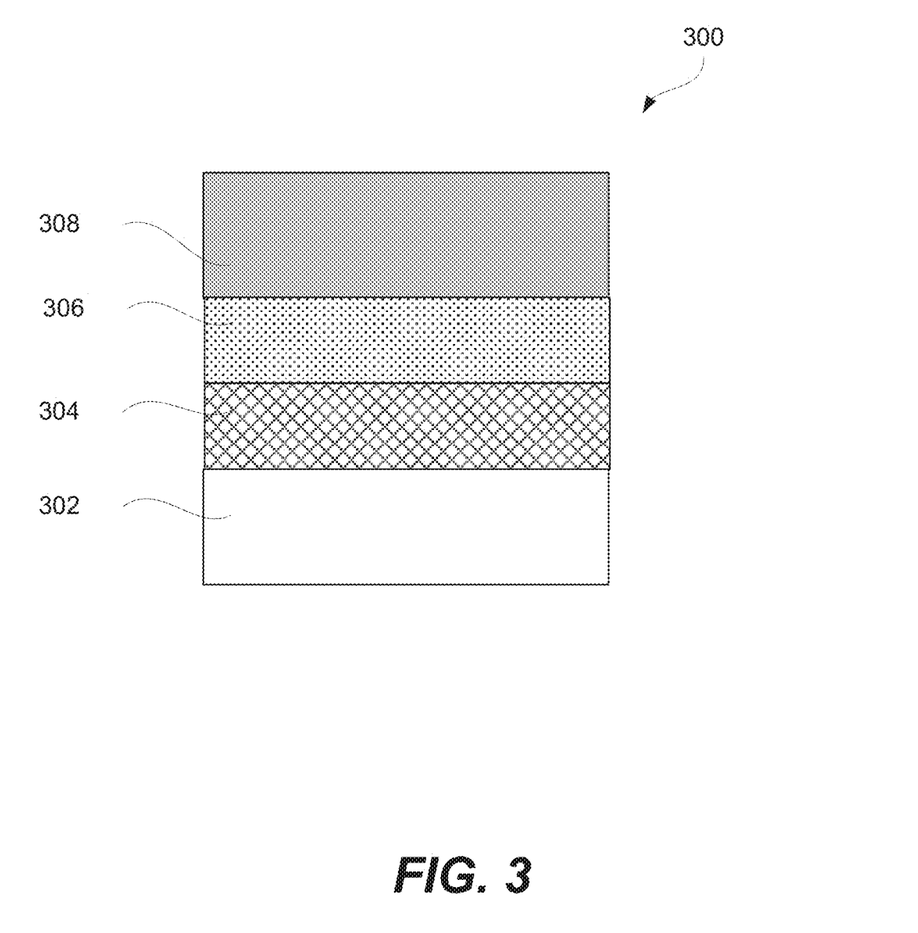
FIG. 3 illustrates a schematic representation of a ReRAM cell including a defect source layer, a defect blocking layer, and a defect acceptor layer disposed between the defect source layer and the defect blocking layer, in accordance with some embodiments.

FIG. 3 illustrates a schematic representation of a ReRAM cell 300, in accordance with some embodiments. ReRAM cell 300 may include first electrode layer 302, a defect source layer 304, a defect acceptor layer 306, and a defect blocking layer 308. In this example, defect blocking layer 308 is also operable as a second electrode. However, in some embodiments, a defect blocking layer and an electrode may be separate components. The "first" and "second" terminology is used herein only for differentiating reasons and does not imply any deposition order or spatial orientation of the layers unless specifically noted.

Defect source layer 304 and defect blocking layer 308 may be formed from materials having different stability. For purposes of this disclosure, stability is defined as the ability of a layer to accept and release various materials or vacancies, such as defects. Stable layers are less prone, in comparison to unstable layers, to accept and release defects whether or not these defects are present in the layer. It should be noted that a stable layer may be converted into an unstable layer by introducing defects into this layer. For example, a stable aluminum oxide layer may be converted into an unstable aluminum oxynitride layer by plasma nitridation and other techniques.

In some embodiments, defect source layer 304 is less stable than defect blocking layer 308, which results in defect source layer 304 bring able to release defects into defect acceptor layer 306, while at the same time defect blocking layer 308 prevents defects from escaping defect acceptor layer 306 into defect blocking layer 308. The defect transfer from defect source layer 304 and into defect acceptor layer 306 may be driven by concentration difference that exists after initial deposition of these layers. Some concentration gradient (but lesser one) continues to exist even after the transfer of defects. In other words, the transfer does not result in a uniform distribution of defects within defect source layer 304 and defect acceptor layer 306 and defect source layer 304 continues to have a higher concentration of defects than defect acceptor layer 306 even after the transfer. After the transfer, defect acceptor layer 306 is formed so called the lowest defect concentration zone that is believed to be responsible for resistive switching. This zone may be also referred to as a switching zone.

Defect source layer 304 may be formed from one or more unstable materials. These materials may be formed by introducing a foreign element into otherwise stable materials. In other words, the formation of defect source layer 304 may involve at least two operations: depositing an initially stable layer and the introducing defects into the stable layer to form an unstable material, which may be also referred to as a compound based material. Additional details of these operations are described below with reference to FIG. 4. Some examples of such materials include aluminum oxynitride (AlON), hafnium oxynitride (HfON), zirconium oxynitride (ZrON), and silicon oxynitride (SiON). Furthermore, inherently unstable materials, such as oxides having multiple phases, may be used to form defect source layer 304. Some examples of such materials include titanium oxide ($TiO_2$, $Ti_4O_3$, $Ti_2O_3$, and $Ti_3O_5$) and tantalum oxide ($TaO$, $TaO_2$, and $Ta_2O_5$).

The thickness of defect source layer 304 may be between about 20 Angstroms and 200 Angstroms or, more specifically, between about 40 Angstroms and 80 Angstroms. The average concentration of defects in defect source layer 304 (prior to transferring some of these defects into defect acceptor layer 306) may be between about 10 atomic percent and 40 atomic percent or, more specifically, between about 15 atomic percent and 30 atomic percent, such as about 20 atomic percent. Some example of defects provided within defect source layer 304 include elements from groups IVA, VA, and VIA of the periodic table, such as carbon, nitrogen, oxygen, silicon, phosphorous, and sulfur. These defects have lower diffusion coefficients than metals and are easier to block. In some embodiments, metals, such as titanium, aluminum, zirconium, and hafnium may be used as defects provided that effective blocking of these defects is achieved and/or less aggressive annealing is used.

The concentration of defects and thickness of defect source layer 304 may be controlled to ensure adequate amount of the defects available for transfer. Prior to the transfer, the defects may be distributed uniformly within defect source layer 304 or non-uniformly. For example, more defects may be present within defect source layer 304 near its interface with defect acceptor layer 306 than elsewhere in defect source layer 304. In another example, more defects may be present within defect source layer 304 near its interface with first electrode 302 than elsewhere in defect source layer 304. This type of defect distribution may be achieved by introducing defects into defect source layer 304 though one of its surfaces, e.g., by plasma nitridation.

Defect acceptor layer 306 may be formed from a relatively stable material in comparison, for example, to defect source layer 304. This stability ensures that defect acceptor layer 306 will not itself become a source of defects. Furthermore, it ensures that defect acceptor layer 306 will not accept excessive amounts of defects during transfer. In some embodiments, the materials of defect acceptor layer 306 and defect source layer 304 have one or more material in common. For example, defect acceptor layer 306 may be formed from aluminum oxide, while defect source layer may be formed from aluminum oxynitride. The materials of defect acceptor layer 306 and defect blocking layer 308 may also have one or more material in common. For example, defect acceptor layer 306 may be formed from aluminum oxide, while defect blocking layer 308 may be formed from aluminum nitride. This commonality of materials may be used to avoid transfer of these materials between layers and creating additional uncontrollable defects that may skew the resistive switching performance. Furthermore, these common materials may be present at comparable concentrations. For example, concentrations of one or more materials (e.g., aluminum in the above example) in two interfacing layers (prior to transfer of defects between the layers) may differ by less than 10 atomic percent or, more specifically, by less than 5 atomic percent. This concentration gradient may be insufficient to move significant amount of the common material. As such, the transfer may be limited to defects.

To the contrary, concentration of defects at the interface formed by defect source layer 304 and defect acceptor layer 306 may vary substantially and, in some embodiments, may be at least about 10 atomic percent or, more specifically, at least about 20 atomic percent and even at least about 30 atomic percent prior to transfer of defects between these layers. This concentration gradient may be sufficient to drive defects from defect source layer 304 and into defect acceptor layer 306. In some embodiments, defect acceptor layer 306 is substantially free of defects prior to transfer of defects between the layers, i.e., the concentration of defects in defect acceptor layer 306 is less than 3 atomic percent or, more specifically, less than 1 atomic percent.

As noted above, defect acceptor layer 306 may be formed from sufficiently stable materials, such as certain stoichiometric oxides and nitrides. Some specific examples include aluminum oxide ($Al_2O_3$), silicon oxide ($SiO_2$), hafnium oxide ($HfO_2$), zirconium oxide ($ZrO_2$), titanium nitride (TiN), tantalum nitride (TaN), and aluminum nitride (AlN). Additional examples include metal carbon nitrides, such as Ta(CN). When aluminum oxide is used as the blocking layer, another material may be form an acceptor layer. It should be noted that these materials do not have multiple phases that may result in exchange of materials with adjacent layers. Examples of materials that include multiple phases include titanium oxide ($TiO_2$, $Ti_4O_3$, $Ti_2O_3$, and $Ti_3O_5$) and tantalum oxide (TaO, $TaO_2$, $Ta_2O_5$) and these materials are believed to be not suitable for defect acceptor layer 306 or for defect blocking layer 308. However, as noted above, titanium oxide and tantalum oxide are good candidates for defect source layer 304 and may supply oxygen vacancies functioning as defects into defect acceptor layer.

The thickness of defect acceptor layer 306 may be between about 20 Angstroms and 200 Angstroms or, more specifically, between about 40 Angstroms and 80 Angstroms. This thickness may depend on the thickness of defect source layer 304 and initial concentration of defects in defect source layer 304 (i.e., the defect concentration prior to annealing that causes the defect transfer) in order to control concentration of defects within defect acceptor layer after the annealing. In some embodiments a thickness ratio of defect acceptor layer 306 to defect source layer 304 is between 10:1 and 1:5 or, more specifically between 2:1 and 1:1.

Defect blocking layer 308 is also formed from a stable material. However, while defect acceptor layer 306 is capable of accepting defects from defect source layer 304, defect blocking layer 308 is not capable of accepting defects from defect acceptor layer 306. This may be achieved by forming defect blocking layer 308 from a material that already includes defects (e.g., titanium nitride when nitrogen functions as a defect) and/or from material that does not accept defects. Some examples of suitable materials include certain stoichiometric oxides and nitrides, such as aluminum oxide ($Al_2O_3$), silicon oxide ($SiO_2$), hafnium oxide ($HfO_2$), zirconium oxide ($ZrO_2$), titanium nitride (TiN), tantalum nitride (TaN), and aluminum nitride (AlN). Additional examples include metal carbon nitride, such as Ta(CN). Materials for defect blocking layer 308 may be separated into two groups. The first group provides general blocking characteristics regardless of the composition of the defect source layer. Stoichiometric oxides with high energy bandgap (e.g., greater than 6 eV) fall into this group. Specific examples include $SiO_2$, $Al_2O_3$, AlN, SiN, and SiON. The second group includes elements that otherwise serve as defects and are supplied by the defect source layer. For example, nitrogen may be used as defects in TiN/AlOx/AlON stack. Since AlON includes nitrogen, it effectively becomes a blocking layer.

In some embodiments, defect blocking layer 308, defect source layer 304, and defect acceptor layer 306 all have one common element. For example, aluminum nitride may be used for defect blocking layer 308, aluminum oxide may be used for defect acceptor layer 306, and aluminum oxynitride may be used for defect source layer 304. In addition to aluminum being locked within the aluminum nitride layer, very mall, if any, diffusion will be experienced by aluminum in this example. The stack of defect source layer 304, defect acceptor layer 306, defect blocking layer 308 may be generally represented by the formula [A][B]/[C]Ox/[C]O[B], in which [A]=Ti, Ta, or W; [B]=N or C; [C]=Hf, Zr, Ta, Ti, or Al. In some embodiments, the defect blocking layer may be also used as an electrode or, more specifically, as a signal line if this layer has a sufficient conductivity. The conductivity may be at least about 1 mOhm-cm.

Returning to FIG. 3, first electrode layer 302 and defect acceptor layer 306 (operable as a second electrode or a separate second electrode) provide electrical connections to ReRAM cell 300. In some embodiments, first electrode layer 302 and/or second electrode layer 306 are parts of signal lines that extend between multiple ReRAM cells, which may be cells provided in the same row or column a memory array as further described below with reference to FIGS. 6A and 6B. In some embodiments, first electrode layer 302 and/or second electrode layer 306 may be separate components from the signal lines. For example, first electrode layer 302 or second electrode layer 306 may be an intermediate electrode and additional components, such as a diode may be provided between this electrode and a signal line.

The electrodes may be made from conductive materials, such as n-doped polysilicon, p-doped polysilicon, titanium nitride, ruthenium, iridium, platinum, and tantalum nitride. The electrodes may have a thickness of less than about 1,000 Angstroms, such as less than about 500 Angstroms and even less than about 100 Angstroms. Thinner electrodes may be formed using ALD techniques.

In some embodiments, first electrode layer 302 does not directly interface with defect source layer 304. A diffusion (not shown) may be disposed between this electrode layer and defect source layer 304. A diffusion barrier may be made from suitable oxygen blocking materials, such as TiSiN, TaSiN, and WSiN. In some embodiments, the diffusion barrier layer is less than about 100 Angstroms thick, for example, between 25 Angstroms and 75 Angstroms thick, such as about 50 Angstroms thick.

In some embodiments, ReRAM cell 300 includes a current limiting layer. This layer may be formed from a material having a suitable work function for controlling the electron flow through ReRAM cell 300. In some embodiments, the current limiting layer is used to increase or decrease the formed barrier height at its interface with the resistive switching layer. This feature is used to improve current flowing characteristics and reduce the magnitude of the switching currents. It should be noted that these changes in the barrier height will generally not affect the ratio of switching currents ($I_{ON}/I_{OFF}$), and thus not impacts detectability of different resistive states.

To achieve desirable electrical and/or physical properties of the current limiting layer, its composition, structure, and/or deposition conditions may be specifically controlled. In some embodiments, the current limiting layer is between about 50 Angstroms and 1000 Angstroms thick, such as between about 200 Angstroms and 50 Angstroms. The current limiting layer may be formed from a material that has a resistivity of between about 5 Ohm-cm and 500 Ohm-cm, such as between about 50 Ohm-cm and 150 Ohm-cm. In other embodiments, the current limiting layer is formed such that its resistance ($R_{RL}$) is between about 10 kilo-Ohm and about 10 mega-Ohm, such as between about 100 kilo-Ohm and about 1 mega-Ohm.

Resistivity is an intrinsic property of the material and can be controlled by adjusting the composition of the material. Some specific examples include adding alloying elements or doping atoms and/or adjusting the morphological structure of the materials, (e.g., shifting from amorphous to crystal structure). In some embodiments, a current limiting layer may include titanium oxide doped with niobium, tin oxide doped with antimony, or zinc oxide doped with aluminum. The concentration of a dopant material in the base material may be between about 0.5 and 25 atomic percent or, more specifically, between about 1 and 10 atomic percent Other examples of materials suitable for the current limiting layer include titanium nitride ($Ti_xN_y$), tantalum nitride ($Ta_xN_y$), silicon nitride (SiN), hafnium nitride ($Hf_xN_y$) or titanium aluminum nitride ($Ti_xAl_yN_z$) layer. Such layer may be formed using ALD, CVD, and PVD techniques.

Processing Examples

Figure 4:
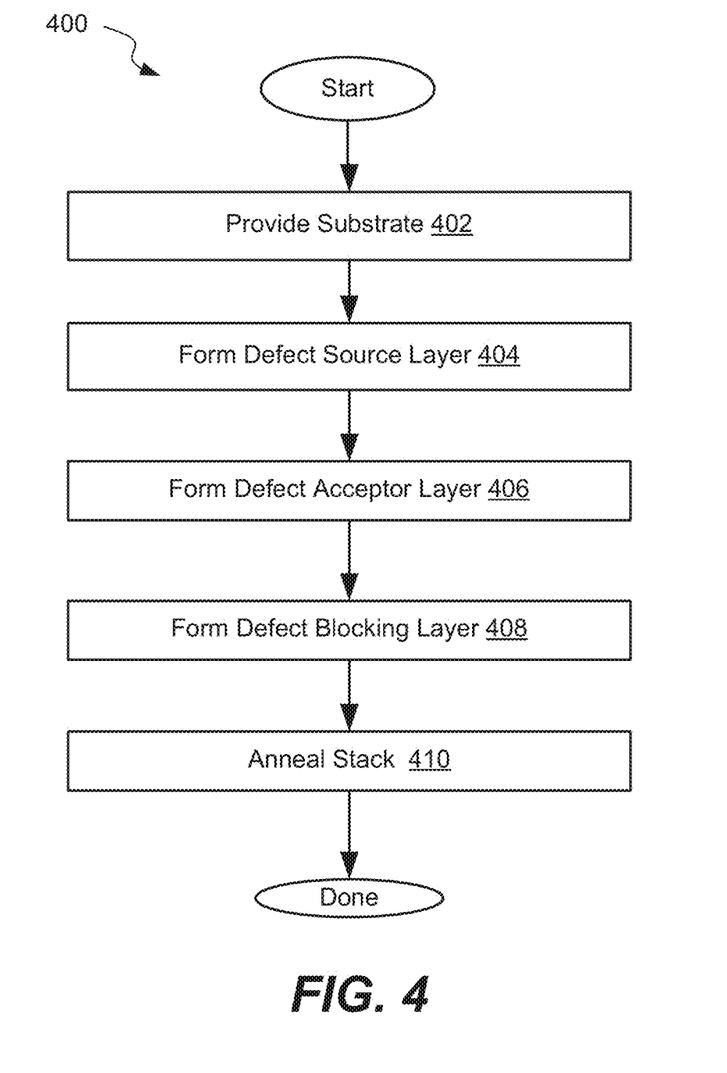
FIG. 4 illustrates a process flowchart corresponding to a method of forming a ReRAM cell, in accordance with some embodiments.

FIG. 4 illustrates a process flowchart corresponding to method 400 of fabricating a ReRAM cell, in accordance with some embodiments. Method 400 may commence with providing a substrate that may include one or more components of the ReRAM cell. For example, an electrode layer may be provided on the substrate. In some embodiments, the substrate may include a defect source layer, a defect blocking layer, and/or a defect acceptor layer forming a stack. If all three layers of the stack are already present on the provided substrate, then method 400 may proceed with redistributing defects within the stack during operation 410. Otherwise, method 400 may proceed with forming the layers of the stack.

Operation 404 involves forming a defect source layer. The defect source layer may be formed over the electrode layer or some other layer. For example, a defect source layer may include aluminum oxynitride. The defect source layer may be formed over an electrode layer. The defect source layer may be formed using ALD, PVD, CVD, or any other suitable technique.

Defects may be added into the defect source layer during its deposition or after. For example, an aluminum oxide layer may be first formed onto a substrate and then subjected to nitridation or, more specifically, to plasma nitridation using ammonia.

In some embodiments, the defect source layer is formed from aluminum oxynitride. The concentration of oxygen in this layer may be between about 30 atomic percent and 50 atomic percent, such as about 40 atomic percent, while the concentration of nitrogen in this layer may be between about 10 atomic percent and 30 atomic percent, such as about 20 atomic percent before annealing during operation 410.

In some embodiments, defects may be introduced into the defect source layer during its deposition. For example, ALD may be used to form a nano-laminate that includes both aluminum nitride and aluminum oxides sub-layers. The number of aluminum nitride layers may be controlled to achieve a specific concentration of nitrogen in the resulting defect source layer.

Method 400 may proceed with forming a defect acceptor layer during operation 406. The defect acceptor layer is formed directly over the defect source layer such that the two layers form an interface. The defects are later transferred through this interface. The defect acceptor layer may be also formed using ALD, PVD, CVD, or other suitable techniques. For example, an aluminum oxide layer may be formed over the defect source layer that includes aluminum oxynitride.

Method 400 may proceed with forming a defect blocking layer during operation 408. The defect blocking layer is formed directly over the defect acceptor layer such that the two layers form an interface. In some embodiments, the defects may be also transferred through this interface from the defect blocking layer and into the defect acceptor layer. The defect blocking layer may be also formed using ALD, PVD, CVD, or other suitable techniques.

The defect blocking layer may include defects and concentration of defects may be greater than, for example, the desired concentration of defects in the defect acceptor layer at the end of the fabrication (i.e., after annealing during operation 410). These defects in the defect blocking layer help to prevent migration of defects into this layer from the defect acceptor layer. In some embodiments, the defect blocking layer may be also used as a source of defects. However, mobility of defects within the defect blocking layer and the defect source layer may be different. For example, the defects in the defect blocking layer may be tightly held (as, e.g., in titanium nitride) while the defects in the defect source layer may be more mobile (as, e.g., in aluminum oxynitride).

Overall, operations 404-408 form a stack that includes a defect source layer, a defect acceptor layer, and a defect blocking layer. In this stack, the defect acceptor layer is disposed between the defect source layer and the defect blocking layer. In some embodiments, the order of the operations may be reversed such that the defect blocking layer is formed first, then the defect acceptor layer is formed over the defect blocking layer, and finally the defect source layer is formed over the defect blocking layer. In this example, the defects may be introduced into the defect source layer during its deposition as opposed to a post-deposition treatment. For example, the defect source layer may be formed as a nano-laminate using ALD techniques. The distribution of defects in the nano-film may be controlled by using a specific order of different sub-layers forming this nano-laminate. Without being restricted to any particular theory, it is believed that combining layers having different compositions (e.g., aluminum oxide and aluminum nitride) into a nano-laminate will create an unstable layer. In another example, the defect source layer may be formed by sputtering a metal (e.g., aluminum, hafnium, zirconium) in an environment containing oxygen and nitrogen. In yet another example, the defect source layer may be formed from a metal oxide capable of changing phases (e.g., titanium oxide. Tantalum oxide) by sputtering this metal in an oxygen containing environment.

Figure 5A:
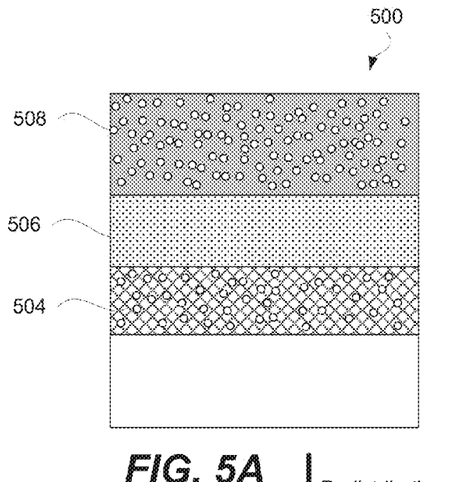
FIGS. 5A and 5B illustrate a schematic representation of a ReRAM cell before and after annealing, which transfers defects from the defect source layer to the defect acceptor layer, in accordance with some embodiments.

FIG. 5A illustrate a schematic representation of a ReRAM cell 500 including a defect source layer 504, a defect acceptor layer 506, and a defect blocking layer 508 before annealing, which transfers defects from defect source layer 504 to defect acceptor layer 506, in accordance with some embodiments. FIG. 5C is an illustrative defect concentration profile within this cell as a function of the location within the cell before the annealing. Specifically, defect acceptor layer 506 may be substantially free of defects at this fabrication stage. Defect source layer 504 and defect blocking layer 508 both have defects.

Method 400 may proceed with annealing, during which defects are transferred from the defect source layer to the defect acceptor layer during operation 410. Operation 410 may involve a conventional activation anneal used for activating diodes, such exposing the stack to 750° C. for 1 minute. In some embodiments, operation 410 may involve exposing the stack to between 500° C. to 800° C. for between 30 seconds and 60 minutes or, more specifically to between about 500° C. and 600° C. for between about 10 minutes and 40 minutes, such as about 550° C. for between about 20 and 30 minutes. Furthermore, operation 410 may involve multiple annealing such as one performed at a high temperature (e.g., a conventional activation anneal) and another one performed a lower temperature and longer duration that are specifically tailored to transfer defects from the defect source layer into the defect acceptor layer in a controlled manner.

In some embodiments, only defects or, more specifically, only one type of defects (e.g., one element) is moving into the defect acceptor layer during operation 410. Other materials or vacancies are not transferred between the layers during this operation. For example, the transfer rate of other elements may be less than 10% that of the defects. As stated above, the mobility of other elements may be restricted by having similar concentrations of these elements in adjacent layers or locking the elements with the layer by, for example, covalent bonding.

In some embodiments, the defect blocking layer includes a metal and substantially no metal is transferred from the defect blocking layer to the defect acceptor layer during transferring the defects from the defect source layer to the defect acceptor layer.

Figure 5B:
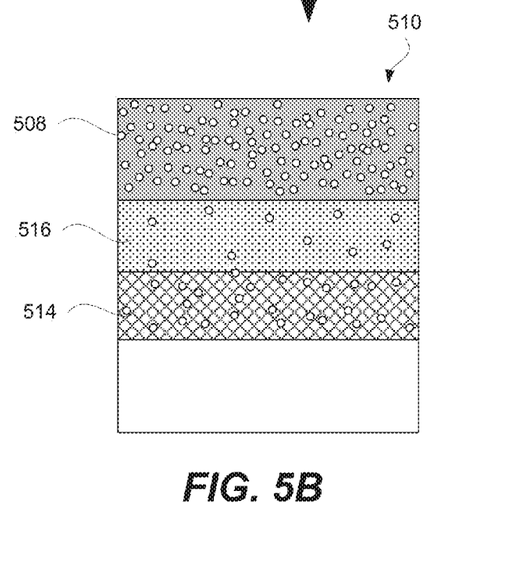
Figure 5C:
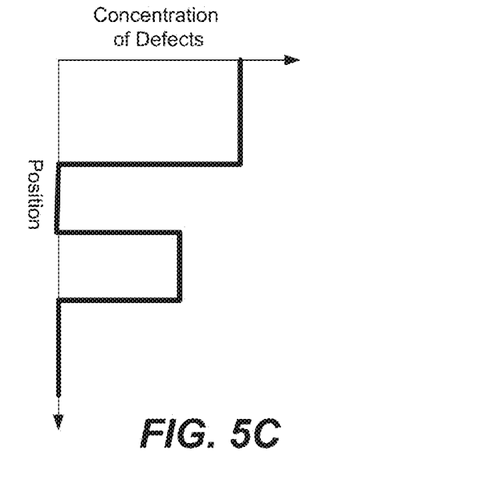
FIGS. 5C and 5D are illustrative defect concentration profiles as a function of the location within the ReRAM cell before and after annealing, which transfers defects from the defect source layer to the defect acceptor layer, in accordance with some embodiments.
Figure 5D:
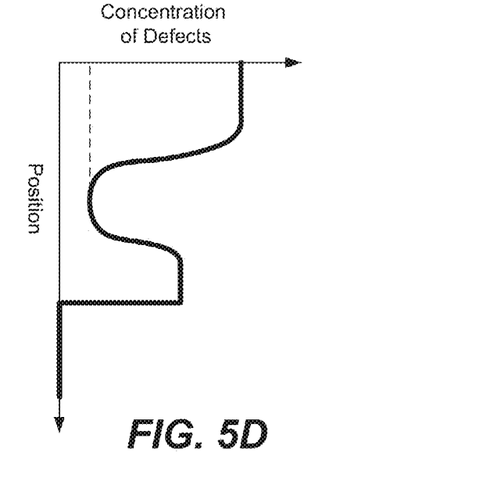

FIG. 5B illustrate a schematic representation of a ReRAM cell 510 including a defect source layer 514, a defect acceptor layer 516, and a defect blocking layer 508 after the annealing that transfers defects from the defect source layer to the defect acceptor layer, in accordance with some embodiments. The defect source layer is now identified as 514, and the defect acceptor layer is now identified as 516 because of the changes in the layers that have occurred during the annealing, i.e., the defect source layer losing the defects while the defect acceptor layer accepting the defects. There may be few if any changes in the defect blocking layer. As such, this layer is still identified as 508. FIG. 5D is an illustrative defect concentration profile within this cell as a function of the location within the cell after the annealing. Specifically, defect acceptor layer 516 now has defects that have transferred from defect source layer 514 and, in some embodiments, from the defect blocking layer. Still, the concentration of defects in defect acceptor layer 516 is less than that in defect source layer 514. As such, defect acceptor layer 516 has the minimum defect concentration zone, which is believed to be responsible for switching. The defect concentration may be higher on each side of this zone.

Figure 5E:
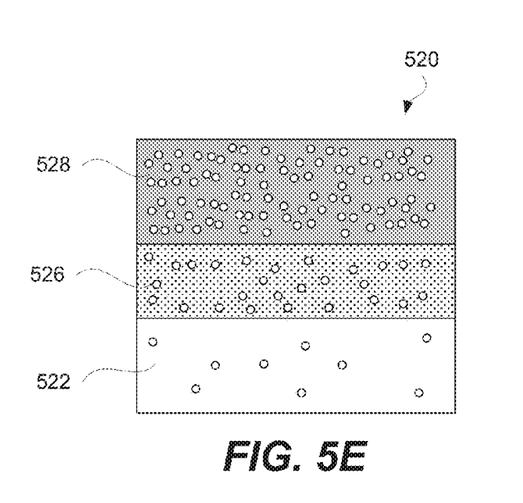
FIG. 5E illustrates a schematic representation of a ReRAM cell that does not include a defect blocking layer, in accordance with some embodiments.
Figure 5F:
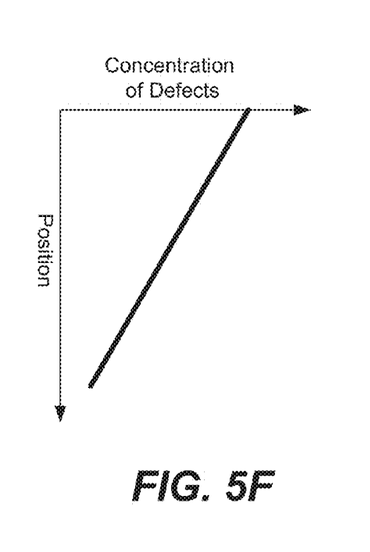
FIG. 5F is an illustrative defect concentration profile as a function of the location within a ReRAM cell that does not include a defect blocking layer, in accordance with some embodiments.

To contract distribution of defects within described ReRAM cells, FIG. 5E illustrates a schematic representation of a ReRAM cell 520 that does not include a defect blocking layer, in accordance with some embodiments. As such, when defect source layer 528 supplies defects into defect acceptor layer 526 the defects continue to flow into other layers, such as layer 522. FIG. 5F is an illustrative defect concentration profile as a function of the location within a ReRAM cell for this type of cells.

Memory Array Examples

Figure 6A:
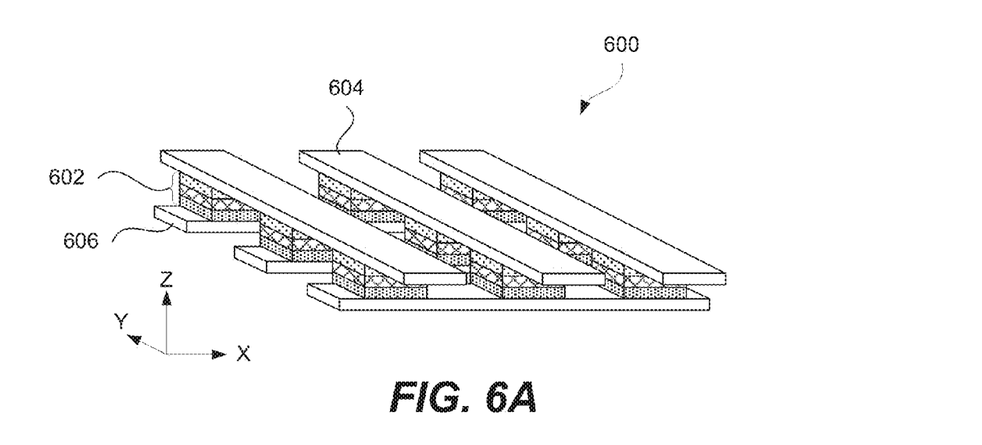
FIGS. 6A and 6B illustrate schematic views of memory arrays including multiple ReRAM cells, in accordance with some embodiments.

A brief description of memory arrays will now be described with reference to FIGS. 6A and 6B to provide better understanding to various aspects of thermally isolating structures provided adjacent to ReRAM cells and, in some examples, surrounding the ReRAM cells. ReRAM cells described above may be used in memory devices or larger integrated circuits (IC) that may take a form of arrays. FIG. 6A illustrates a memory array 600 including nine ReRAM cells 602, in accordance with some embodiments. In general, any number of ReRAM cells may be arranged into one array. Connections to each ReRAM cell 602 are provided by signal lines 604 and 606, which may be arranged orthogonally to each other. ReRAM cells 602 are positioned at crossings of signal lines 604 and 606 that typically define boundaries of each ReRAM cell in array 600.

Signal lines 604 and 606 are sometimes referred to as word lines and bit lines. These lines are used to read and write data into each ReRAM cell 602 of array 600 by individually connecting ReRAM cells to read and write controllers. Individual ReRAM cells 602 or groups of ReRAM cells 602 can be addressed by using appropriate sets of signal lines 604 and 606. Each ReRAM cell 602 typically includes multiple layers, such as top and bottom electrodes, resistance switching layer, embedded resistors, embedded current steering elements, and the like, some of which are further described elsewhere in this document. In some embodiments, a ReRAM cell includes multiple resistance switching layers provided in between a crossing pair of signal lines 604 and 606.

As stated above, various read and write controllers may be used to control operations of ReRAM cells 602. A suitable controller is connected to ReRAM cells 602 by signal lines 604 and 606 and may be a part of the same memory device and circuitry. In some embodiments, a read and write controller is a separate memory device capable of controlling multiple memory devices each one containing an array of ReRAM cells. Any suitable read and write controller and array layout scheme may be used to construct a memory device from multiple ReRAM cells. In some embodiments, other electrical components may be associated with the overall array 600 or each ReRAM cell 602. For example, to avoid the parasitic-path-problem, i.e., signal bypasses by ReRAM cells in their low resistance state (LRS), serial elements with a particular non-linearity must be added at each node or, more specifically, into each element. Depending on the switching scheme of the ReRAM cell, these elements can be diodes or varistor-type elements with a specific degree of non-linearity. In the same other embodiments, an array is organized as an active matrix, in which a transistor is positioned at each node or, more specifically, embedded into each cell to decouple the cell if it is not addressed. This approach significantly reduces crosstalk in the matrix of the memory device.

Figure 6B:
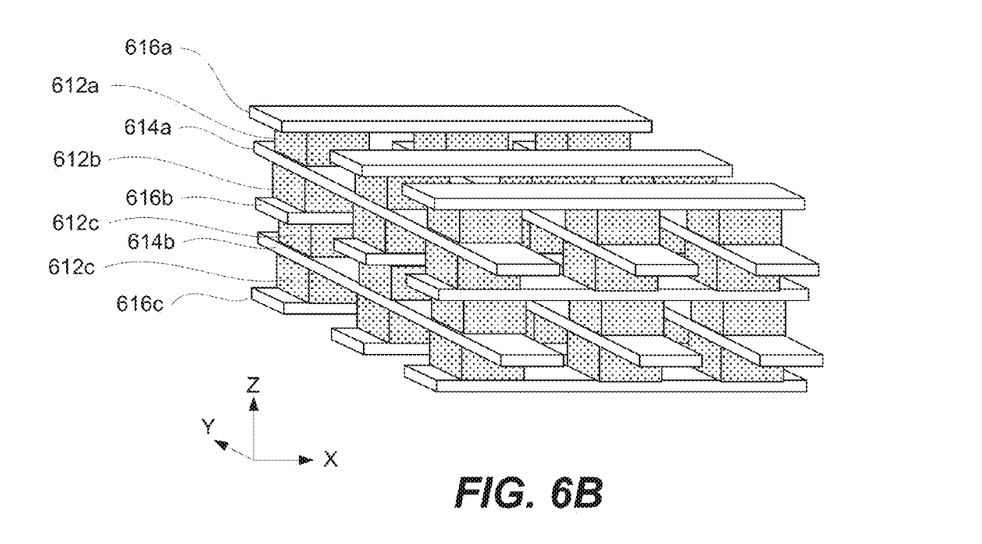

In some embodiments, a memory device may include multiple array layers as, for example, illustrated in FIG. 6B. In this example, five sets of signal lines 614a-b and 616a-c are shared by four ReRAM arrays 612a-c. As with the previous example, each ReRAM array is supported by two sets of signal lines, e.g., array 612a is supported by 614a and 616a. However, middle signal lines 614a-b and 616b, each is shared by two sets ReRAM arrays. For example, signal line set 614a provides connections to arrays 612a and 612b. Top and bottom sets of signal lines 616a and 616c are only used for making electrical connections to one array. This 3-D arrangement of the memory device should be distinguished from various 3-D arrangements in each individual ReRAM cell.

Experimental Data

An experiment was conducted to determined performance of ReRAM cells, each built with a defect source layer, a defect acceptor layer, and a defect blocking layer. This performance was compared with conventional cells that did not include at least one of these layers, i.e., control cells. Two types of control cells were used in this experiment. One type of cell included a resistive switching layer formed from aluminum oxide ($Al_2O_3$) without any defects added during or after its deposition. Another type of control cell included a resistive switching layer formed from aluminum oxynitride (AlON) by converting an initial deposited aluminum oxide layer into the aluminum oxynitride. Ammonia-based plasma nitridation was used for this conversion.

The test cells included a defect source layer containing aluminum oxynitride and a defect acceptor layer containing aluminum oxide. These layers were deposited in a manner similar to the first control cells (for the defect acceptor layer) and in a manner similar to the second control cells (for the defect source layer). In other words, each test cell included a resistive switching layer of a first control cell operable as a defect acceptor layer and a resistive switching layer of a second control cell operable as a defect source layer.

All cells (both types of control cells and test cells) included n-doped polysilicon electrodes on one side and titanium nitride electrodes on the other side. In the test cells, the n-doped polysilicon electrodes interfaced the defect source layers, while the titanium nitride layers interfaced the defect acceptor layer. All cells were subject to anneal at 750° C. for 1 minute prior to testing their resistive switching characteristics.

Figure 7:
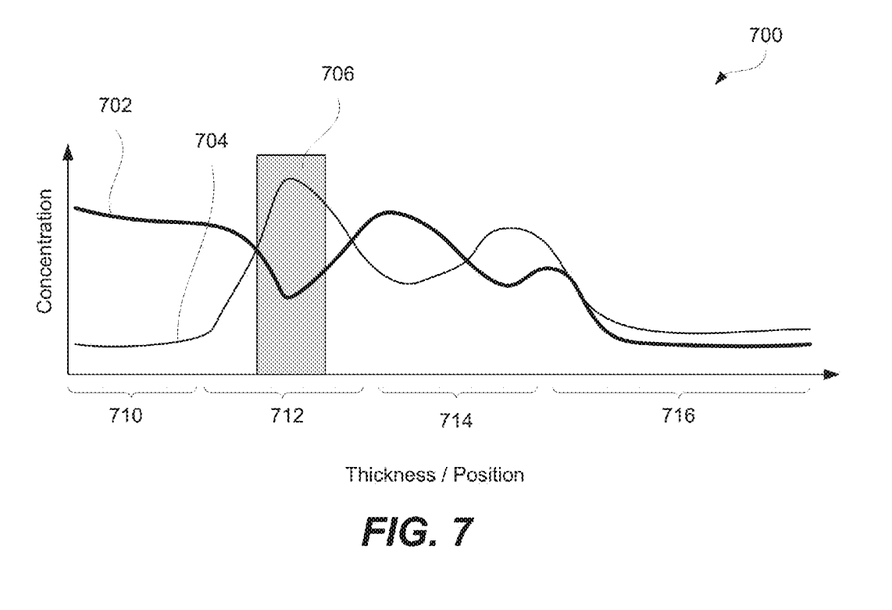
FIG. 7 illustrates plots of a nitrogen concentration and an oxygen concentration as a function of the position within a test cell after its annealing.

Resistive switching characteristics of these three types of cells were then tested. The cells were switched between their high resistive states and low resistive states using bipolar switching methodology and the highest switching voltages have been identified. The following testing parameters were used: Start Voltage=1 V, voltage increase steps=0.2V, Pulse during=100 ns. The test cells demonstrated a lower reset voltage (i.e., a voltage used to switch from the low resistive state to the high resistive state) than both types of control cells. Specifically, the average reset voltage for the test cell was 5.8V, while the average reset voltage for the first type of the control cells (i.e., the cells with aluminum oxide resistive switching layers) was 6.3V and the average reset voltage for the second type of the control cells (i.e., the cells with aluminum oxynitride resistive switching layers) was 7.6V. In other words, the reduction in the reset voltage was 8% and 25% respectively for the test cells in comparison to the two types of the control cells. It is believed that further improvement could be achieved by specifically tailoring relative thicknesses of the defect source layer and the defect acceptor layer. Distribution of nitrogen and oxygen within the test cells was studied using secondary ion mass spectrometry (SIMS). FIG. 7 illustrates plots of a nitrogen concentration 702 and an oxygen concentration 704 as a function of the location within a test cell after its annealing. The location of the defect blocking layer (i.e., the titanium nitride electrode) is identified as 710, the location of the defect acceptor layer is identified as 712, the location of the defect source layer is identified as 714, and finally the location of the doped polysilicon electrode is identified as 716. Between the defect acceptor layer 712 and the defect source layer 714, the lowest nitrogen concentration was within the defect acceptor layer 712 and identified with block 706. This location within the cell connection to block 706 may be referred to as the lowest defect concentration zone. Without being restricted to any particular theory, it is believe that the resistive switching occurs within this zone. The fact that nitrogen concentration 702 tapers down within doped polysilicon electrode is irrelevant since nitrogen is not capable of sufficiently impact resistance of this layer

CONCLUSION

Although the foregoing examples have been described in some detail for purposes of clarity of understanding, the invention is not limited to the details provided. There are many alternative ways of implementing the invention. The disclosed examples are illustrative and not restrictive.

What is claimed:

1. A resistive random access memory cell comprising:
   a first layer operable as a defect source layer,
      the first layer comprising a first material being one of aluminum oxynitride, hafnium oxynitride, zirconium oxynitride, silicon oxynitride, titanium oxide, or tantalum oxide;
   a second layer operable as a defect acceptor layer,
      the second layer comprising a second material being one of aluminum oxide, silicon oxide, hafnium oxide, zirconium oxide, titanium nitride, tantalum nitride, or aluminum nitride; and
   a third layer operable as a defect blocking layer,
      the third layer comprising a third material being one of aluminum oxide, silicon oxide, hafnium oxide, zirconium oxide, aluminum nitride, silicon nitride, or silicon oxynitride,
      wherein the second layer is disposed between and directly interfaces the first layer and the third layer, and
      wherein the second layer has a lower concentration of defects than each of the third layer and the first layer prior to transferring the defects into the second layer.

2. The resistive random access memory cell of claim 1, wherein the first material, the second material, and the third material comprise a common element.

3. The resistive random access memory cell of claim 2, wherein the common element is aluminum.

4. The resistive random access memory cell of claim 2, wherein a concentration of aluminum in the first layer and the second layer differs by less than 10% atomic.

5. The resistive random access memory cell of claim 1, wherein the defects are one of carbon, nitrogen, oxygen, silicon, phosphorous, or sulfur.

6. The resistive random access memory cell of claim 1, wherein the defects at the first layer has a highest concentration at a surface facing away from the second layer.

7. The resistive random access memory cell of claim 1, wherein the second layer is operable as a resistive switching zone of the resistive random access memory.

8. The resistive random access memory cell of claim 1, wherein the first layer has a thickness of between about 40 Angstroms and 80 Angstroms.

9. The resistive random access memory cell of claim 1, wherein the first material is aluminum oxynitride, and wherein the second material is aluminum oxide.

10. The resistive random access memory cell of claim 9, wherein the third material is aluminum nitride.

11. The resistive random access memory cell of claim 1, wherein a ratio of a thickness of the second layer to a thickness of the first layer is between 2:1 and 1:1.

12. The resistive random access memory cell of claim 1, wherein the third material is a stoichiometric oxide an energy bandgap of greater than 6 e V.

13. The resistive random access memory cell of claim 1, wherein the third material comprises defects.

14. The resistive random access memory cell of claim 1, wherein the first layer is disposed between the second layer and an electrode.

15. The resistive random access memory cell of claim 14, wherein the electrode comprises tantalum nitride.

* * * * *